United States Patent
Chang et al.

(10) Patent No.: US 9,502,647 B2
(45) Date of Patent: Nov. 22, 2016

(54) RESISTIVE RANDOM-ACCESS MEMORY (RRAM) WITH A LOW-K POROUS LAYER

(71) Applicant: Taiwan Semiconductor Manufacturing Company Limited, Hsinchu (TW)

(72) Inventors: Ting-Chang Chang, Kaohsiung (TW); Kuan-Chang Chang, Kaohsiung (TW); Tsung-Ming Tsai, Kaohsiung (TW); Chih-Hung Pan, Taichung (TW); Ying-Lang Wang, Tai-Chung (TW); Kei-Wei Chen, Tainan (TW); Shih-Chieh Chang, Taipei (TW); Te-Ming Kung, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/288,688

(22) Filed: May 28, 2014

(65) Prior Publication Data
US 2015/0349251 A1    Dec. 3, 2015

(51) Int. Cl.
*H01L 45/00*        (2006.01)

(52) U.S. Cl.
CPC ........... *H01L 45/1233* (2013.01); *H01L 45/08* (2013.01); *H01L 45/1253* (2013.01); *H01L 45/145* (2013.01); *H01L 45/146* (2013.01); *H01L 45/1625* (2013.01)

(58) Field of Classification Search
CPC .................. H01L 45/04; H01L 45/1253; H01L 45/145; H01L 45/146; H01L 45/08; H01L 45/1233

See application file for complete search history.

(56) References Cited

U.S. PATENT DOCUMENTS

| | | | |
|---|---|---|---|
| 8,298,891 B1* | 10/2012 | Chiang | H01L 45/10 257/E21.008 |
| 2004/0232893 A1* | 11/2004 | Odagawa | H01L 37/00 320/154 |
| 2005/0285095 A1* | 12/2005 | Happ | 257/2 |
| 2011/0007551 A1* | 1/2011 | Tian et al. | 365/148 |
| 2012/0305880 A1* | 12/2012 | Zhang et al. | 257/4 |
| 2013/0026438 A1* | 1/2013 | Wang et al. | 257/4 |
| 2014/0113428 A1* | 4/2014 | Lin et al. | 438/382 |

(Continued)

*Primary Examiner* — Latanya N Crawford
(74) *Attorney, Agent, or Firm* — Jones Day

(57) ABSTRACT

A resistive memory cell is disclosed. The resistive memory cell comprises a pair of electrodes and a resistance-switching network disposed between the pair of electrodes. The resistance-switching network comprises a group-IV element doping layer and a porous low-k layer. The group-IV doping layer comprises silicon oxide doped with a group-IV element. The porous low-k layer comprises porous silicon oxide or porous hafnium oxide. The group-IV element may comprise zirconium, titanium, or hafnium. The porous low-k layer may be prepared by inductively coupled plasma (ICP) treatment. A method of fabricating a resistive memory is disclosed. The method comprises forming a resistance-switching network on a first electrode using sputtering and forming a second electrode on the resistance-switching network using sputtering. The resistance-switching network comprises a group-IV element doping layer and a porous low-k layer.

10 Claims, 3 Drawing Sheets

(56) References Cited

U.S. PATENT DOCUMENTS

| 2014/0175356 | A1* | 6/2014 | Wang .................. H01L 45/1293 |
| | | | 257/2 |
| 2014/0192589 | A1* | 7/2014 | Maxwell et al. ............. 365/148 |
| 2014/0353566 | A1* | 12/2014 | Wang et al. ...................... 257/2 |
| 2015/0064886 | A1* | 3/2015 | Rueckes ............ H01L 29/1606 |
| | | | 438/500 |

* cited by examiner

RESISTIVE RANDOM-ACCESS MEMORY (RRAM) WITH A LOW-K POROUS LAYER

BACKGROUND

The technology described in this patent document relates to resistive random access memory (RRAM), and more specifically to the resistive oxide-based layer in RRAM devices.

Resistive random access memory (RRAM) is a type of non-volatile memory having a memory cell that consists of a resistive oxide-based layer sandwiched between two electrodes. RRAM is a candidate for next generation non-volatile memory because of its low cost, simple structure, fast operation speed, low operation power, and non-destructive readout properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
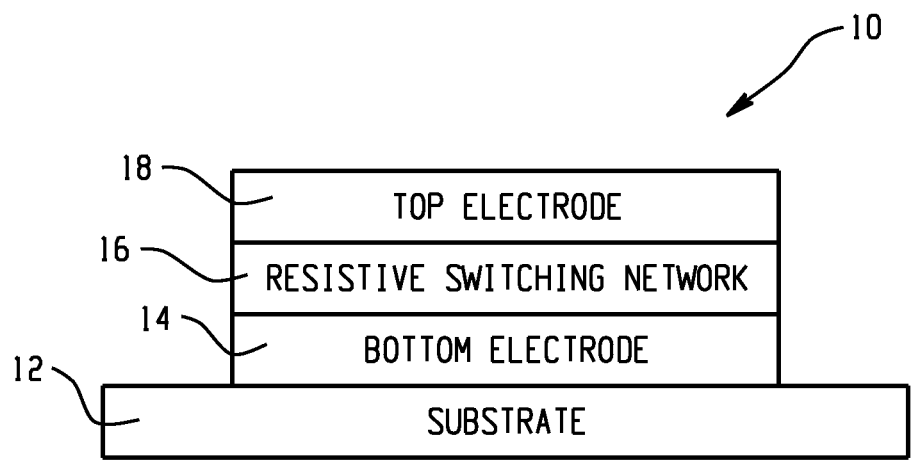
FIG. 1 depicts a cross-sectional view of an example RRAM cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) is a type of non-volatile memory having a memory cell that consists of a resistive oxide-based layer sandwiched between two electrodes. FIG. 1 depicts a cross-sectional view of an example RRAM cell. An RRAM cell 10 is formed on a substrate 12. The RRAM cell 10 includes a lower electrode 14, which is a first electrode or a bottom electrode, a resistance-switching network 16, and an upper electrode 18, which is a second electrode or a top electrode.

The RRAM cell 10 may have two or more states with different electric resistance values. Each state may represent a different digital value. The RRAM cell 10 may switch from one state to another by applying a predetermined voltage or current to the RRAM cell 10. For example, the RRAM cell 10 has a state of relatively high resistance, referred to as "a high resistance state", and a state of relatively low resistance, referred to as "a low resistance state". The RRAM cell 10 may be switched from the high resistance state to the low resistance state or from the low resistance state to high resistance state by applying a predetermined voltage or current.

The substrate 12 may be a substrate employed in a semiconductor process, such as a silicon substrate. The substrate 12 may comprise a complementary metal oxide semiconductor (CMOS) circuit, an isolation structure, a diode, or a capacitor.

A bottom electrode 14 may be formed on the substrate 12. The bottom electrode 14 can be electrically connected to a terminal of a transistor (not shown) or some other semiconductor device fabricated on the substrate 12. The bottom electrode 14 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode 14 may be between a range of about 5-500 nm.

A resistance-switching network 16 may be formed on the bottom electrode 14 and contacts with the bottom electrode 14. The material for the resistance-switching network may comprise a composite of metal, Si, and O. The thickness of the resistance-switching network 16 may be between a range about 1-100 nm. The metal in the resistance-switching network may comprise W, Ta, Ti, Ni, Co, Hf, Ru, Zr, Zn, Fe, Sn, Al, Cu, Ag, Mo, Cr, or combinations thereof.

A top electrode 18 may be formed on the resistance-switching network 16. The top electrode 18 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 18 may be between a range of about 5-500 nm.

Figure 2:
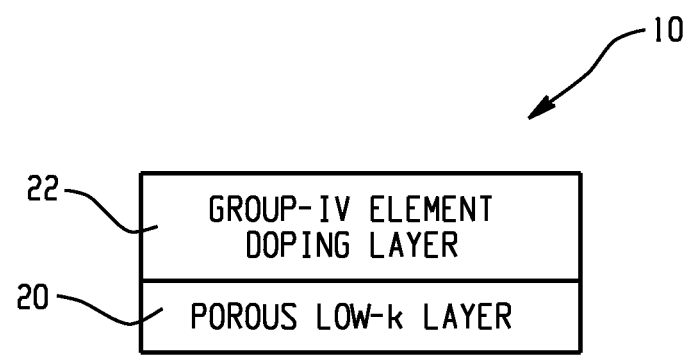
FIG. 2 depicts a cross-sectional view of an example resistance-switching network, in accordance with some embodiments.

FIG. 2 depicts a cross-sectional view of an example resistance-switching network 16. The example resistance-switching network 16 is a multi-layer resistance-switching network having at least two layers. In this example, two layers are shown. The example resistance-switching network comprises a porous low-k layer 20 and a group-IV element doping layer 22, wherein the porous low-k layer 20 is disposed between the group-IV element doping layer 22 and the bottom electrode 14. Other configurations of layers within the resistance-switching network 16 may be used including additional layers or a change in the layout order of the layers. The thickness of the resistance-switching network is between 10 and 40 nm and may be 20 nm.

The group-IV element doping layer comprises a metal material doped into a dielectric material. The dielectric material in this example comprises silicon oxide or hafnium oxide such as $SiO_2$ or $HfO_2$. The metal material is a group-IV element such as zirconium, titanium, or hafnium. In the example system, zirconium doped into SiOx (referred to as Zr:SiOx) is used in the group-IV element doping layer. The thickness of the group-IV element doping layer is greater than the thickness of the porous low-k layer.

The porous low-k layer comprises porous silicon oxide or porous hafnium oxide. In this example, the porous low-k layer is prepared by inductively coupled plasma (ICP) treatment.

After RRAM cell fabrication, a conduction route is formed, and the resistance state corresponds to the low-resistance state (LRS). The LRS may indicate a logic state of 1. A non-conductor with oxide-based compound is produced by a reverse bias to block the conduction route. The associated resistance state is the high-resistance state (HRS), which may indicate a logic state of 0.

Figure 3:
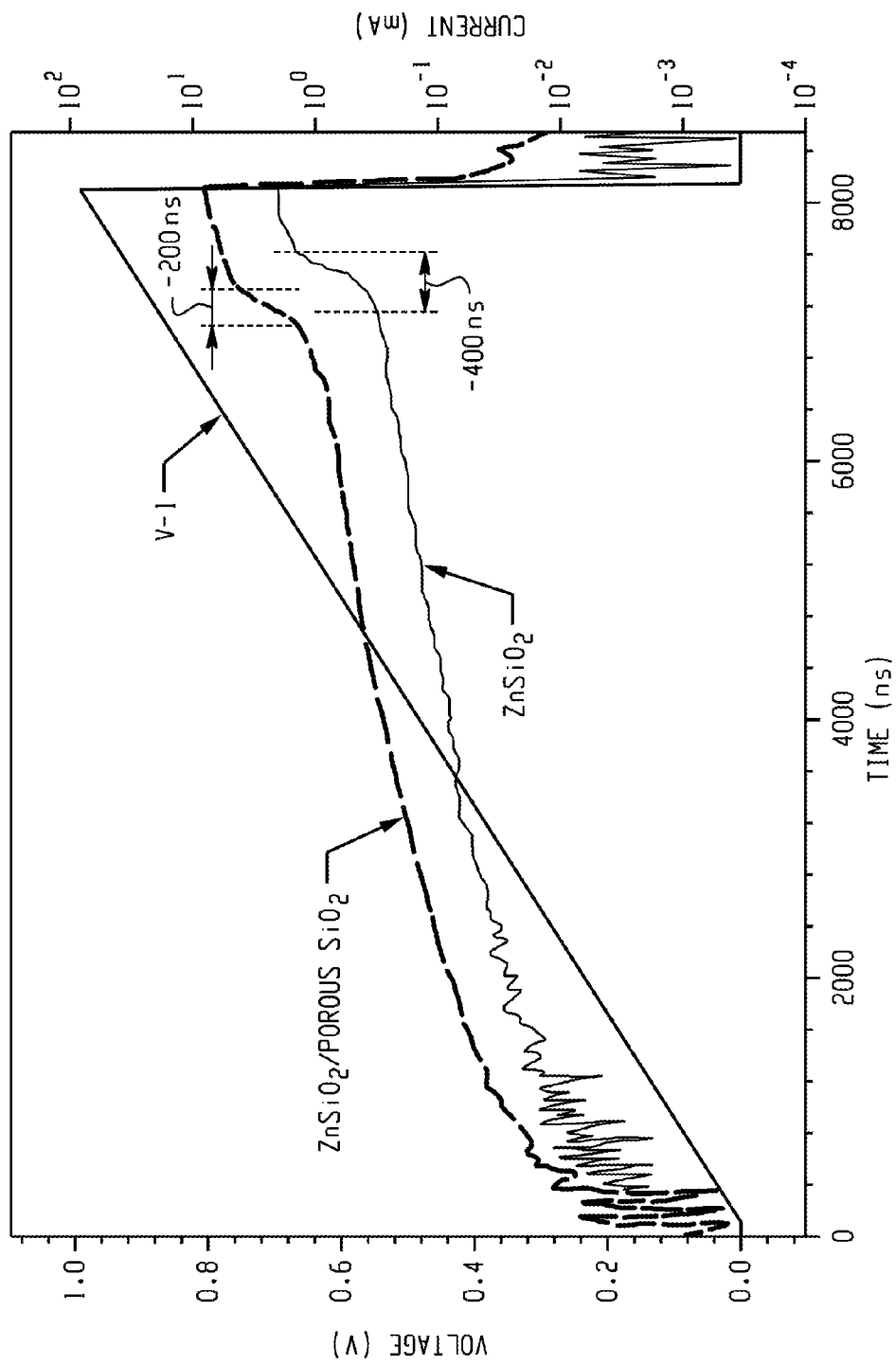
FIG. 3 is a graph illustrating that the resistance-switching speed of a resistance-switching network from one state to another may be increased by the use of a low-k porous layer in the resistance-switching network.

FIG. 3 is a graph illustrating that the resistance-switching speed of a resistance-switching network from one state to another may be increased by the use of a low-k porous layer in the resistance-switching network. As illustrated in the figure, a resistance-switching network comprising a single layer of material may have a switching time of 400 ns. A resistance-switching network comprising two layers of material (i.e., a group-IV element doping layer and a porous low-k layer) may have a switching time of 200 ns. The computation speed of the memory cell may be increased by the use of the porous low-k layer in the resistance-switching network.

Figure 4:
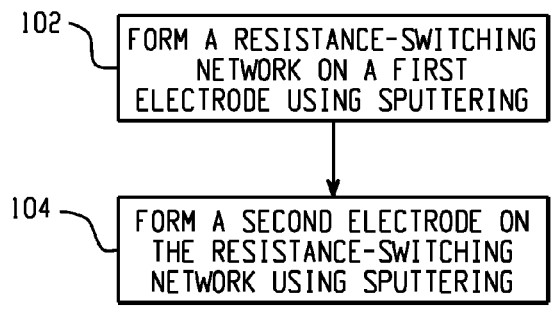
FIG. 4 is a process flow chart depicting an example method of forming a RRAM cell having multiple layers in a resistance-switching network, in accordance with some embodiments.

FIG. 4 is a process flow chart depicting an example method of forming a RRAM cell having multiple layers in a resistance-switching network. A resistance-switching network may be formed on a first electrode (which in turn is on a substrate) using sputtering (operation 102). The resistance-switching network comprises a group-IV element doping layer and a porous low-k layer. A second electrode may be formed on the resistance-switching network using sputtering (operation 104).

Figure 5:
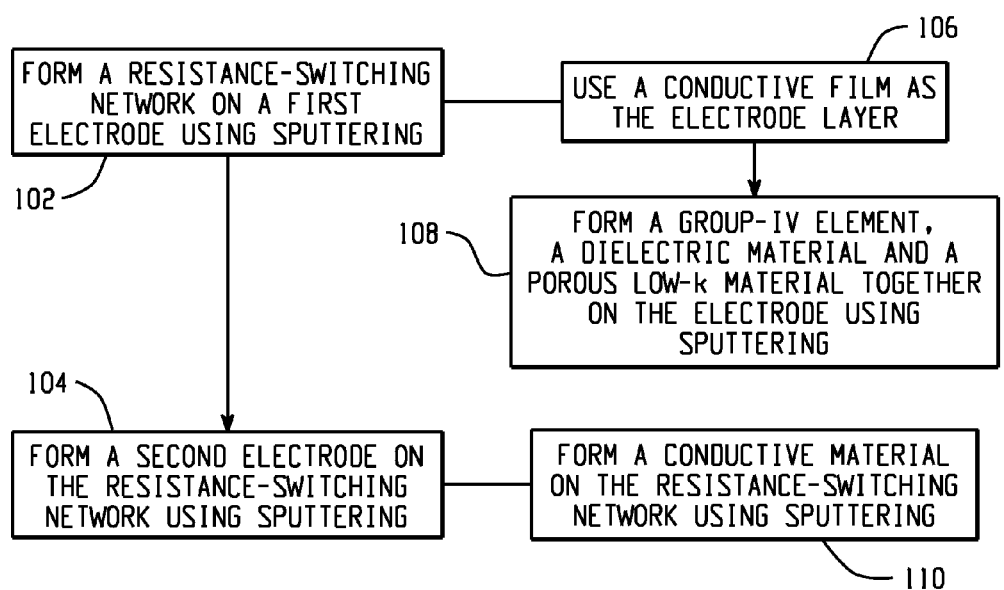
FIG. 5 is a process flow chart depicting another example method of forming a RRAM cell having multiple layers in a resistance-switching network, in accordance with some embodiments.

FIG. 5 is a process flow chart depicting another example method of forming a RRAM cell having multiple layers in a resistance-switching network. The method of FIG. 5 is similar to that of FIG. 4 but provides additional operations that may occur in forming a RRAM cell. Forming a resistance-switching network on a first electrode using sputtering (operation 102) may involve using a conductive film as the electrode layer (operation 106), and forming a group-IV element, a dielectric material and a porous low-k material together on the electrode using sputtering (operation 108). In this example, the conductive film may be a titanium nitride film and the dielectric material may comprise silicon oxide or hafnium oxide. The group-IV element may comprise zirconium, titanium, or hafnium. The porous low-k material may comprise porous silicon oxide or porous hafnium oxide. Finally, forming a second electrode on the resistance-switching network using sputtering (operation 104) may involve forming a conductive material on the resistance-switching network using sputtering (operation 110). In this example, the conductive material may comprise platinum.

Figure 6:
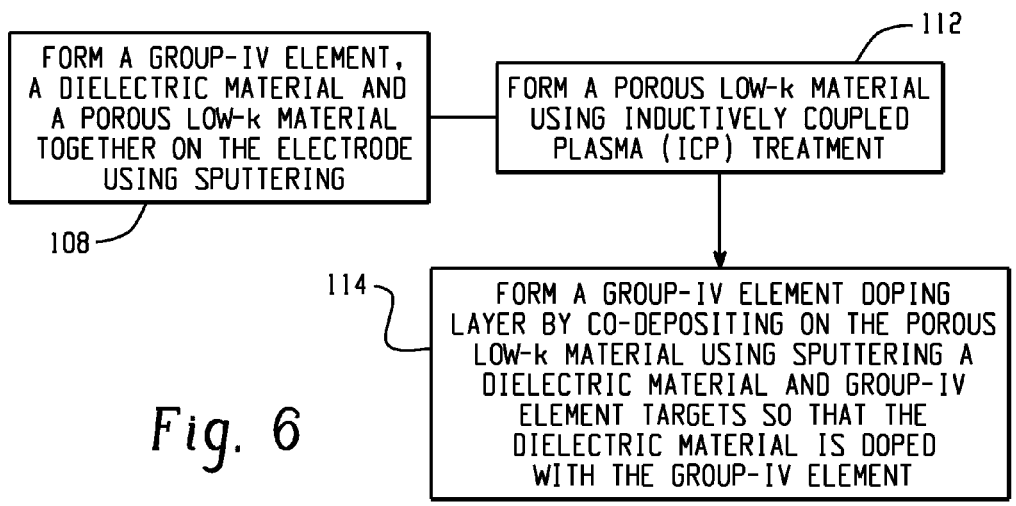
FIG. 6 is a process flow chart depicting an example method of forming a group-IV element, a dielectric material and a porous low-k material together on the electrode using sputtering, in accordance with some embodiments.

FIG. 6 is a process flow chart depicting an example method of forming a group-IV element, a dielectric material and a porous low-k material together on the electrode using sputtering. This example method involves forming a porous low-k material using inductively coupled plasma (ICP) treatment (operation 112) and forming a group-IV element doping layer by co-depositing on the porous low-k material using sputtering a dielectric material and group-IV element targets so that the dielectric material is doped with the group-IV element (operation 114). In this example, the dielectric material may comprise silicon oxide or hafnium oxide. The group-IV element may comprise zirconium, titanium, or hafnium. The porous low-k layer may comprise porous silicon oxide or porous hafnium oxide.

The example structures and methods disclosed herein may result in a RRAM cell with improved endurance of the resistive memory. The example structures and methods disclosed herein may also result in increased resistance-switching speed of the RRAM cell.

In one embodiment, disclosed is a resistive memory comprising a first electrode and a second electrode and a resistance-switching network disposed between the first electrode and the second electrode. The resistance-switching network comprises a group-IV element doping layer and a porous low-k layer.

These aspects and other embodiments may include one or more of the following features. The group-IV element doping layer may comprise a metal material doped into a dielectric material. The dielectric material may comprise silicon oxide or hafnium oxide. The metal material may comprise zirconium, titanium, or hafnium. The porous low-k layer may comprise porous silicon oxide or porous hafnium oxide. The porous low-k layer may be prepared by inductively coupled plasma (ICP) treatment. The first electrode may be disposed on a substrate and the porous low-k layer may be disposed between the first electrode and the group-IV element doping layer. Each of the first and second electrodes may comprise conductive material. The conductive material may comprise platinum or titanium nitride. The thickness of the resistance-switching network may be between 10 and 40 nm.

In another embodiment, a method of fabricating a resistive memory is disclosed. The method comprises forming a resistance-switching network on a first electrode using sputtering and forming a second electrode on the resistance-switching network using sputtering. The resistance-switching network comprises a group-IV element doping layer and a porous low-k layer.

These aspects and other embodiments may include one or more of the following features. Forming a resistance-switching network on a first electrode using sputtering may comprise using a conductive film as the electrode layer and forming a group-IV element, a dielectric material and a porous low-k material together on the electrode using sputtering. The conductive film may be a titanium nitride film. Forming a group-IV element, a dielectric material and a porous low-k material together on the electrode using sputtering may comprise forming a porous low-k material using inductively coupled plasma (ICP) treatment and forming a group-IV element doping layer by co-depositing on the porous low-k material using sputtering a dielectric material and group-IV element targets so that the dielectric material is doped with the group-IV element. The dielectric material may comprise silicon oxide or hafnium oxide. The group-IV element may comprise zirconium, titanium, or hafnium. The porous low-k layer may comprise porous silicon oxide or porous hafnium oxide. The method of claim 11, wherein the Forming a second electrode on the resistance-switching network using sputtering may comprise forming a conductive material on the resistance-switching network using sputtering. The conductive material may comprise platinum.

In another embodiment, a resistive memory cell is disclosed. The resistive memory cell comprises a pair of electrodes and a resistance-switching network disposed between the pair of electrodes. The resistance-switching network comprises a group-IV element doping layer and a porous low-k layer. The group-IV doping layer comprises silicon oxide doped with a group-IV element. The porous low-k layer comprises porous silicon oxide or porous hafnium oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a resistive memory, comprising: forming a first conductive film as a first electrode; forming a group-IV element, a dielectric material, and a porous low-k layer together using sputtering to form a resistance-switching network on the first electrode, wherein forming the group-IV element, the dielectric material, and the porous low-k layer together using sputtering comprises forming the porous low-k layer using inductively coupled plasma (ICP) treatment, and forming the group-IV element by co-depositing on the porous low-k layer the dielectric material and the group-IV element using sputtering so that the dielectric material is doped with the group-IV element; and forming a second conductive film as a second electrode on the resistance-switching network using sputtering.

2. The method of claim 1, wherein forming the first conductive film comprises forming a titanium nitride film as the first conductive film.

3. The method of claim 1, wherein the dielectric material includes at least one of silicon oxide and hafnium oxide.

4. The method of claim 1, wherein the group-IV element includes at least one of zirconium, titanium, and hafnium.

5. The method of claim 1, wherein the porous low-k layer includes at least one of porous silicon oxide and porous hafnium oxide.

6. The method of claim 1, wherein forming the second electrode on the resistance-switching network using sputtering comprises:
   forming a conductive material on the resistance-switching network using sputtering.

7. The method of claim 6, wherein the conductive material comprises at least one of platinum and titanium nitride.

8. The method of claim 1, wherein forming the group-IV element, the dielectric material, and the porous low-k layer together using sputtering further comprises forming the resistance-switching network to a thickness of between 10 and 40 nm.

9. A memory device fabricated in accordance with the method of claim 1.

10. The method of claim 1, wherein forming the group-IV element, the dielectric material, and the porous low-k layer together using sputtering is such that the group-IV element has a thickness greater than the porous low-k layer.

\* \* \* \* \*